United States Patent
Chiou et al.

(10) Patent No.: US 11,450,564 B2
(45) Date of Patent: Sep. 20, 2022

(54) METHOD FOR FABRICATING SEMICONDUCTOR DEVICE

(71) Applicant: UNITED MICROELECTRONICS CORP., Hsin-Chu (TW)

(72) Inventors: Jin-Yan Chiou, Tainan (TW); Wei-Chuan Tsai, Changhua County (TW); Yen-Tsai Yi, Tainan (TW); Li-Han Chen, Tainan (TW); Hsiang-Wen Ke, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/568,266

(22) Filed: Sep. 12, 2019

(65) Prior Publication Data
US 2021/0050253 A1 Feb. 18, 2021

(30) Foreign Application Priority Data
Aug. 15, 2019 (TW) .................. 108129117

(51) Int. Cl.
*H01L 21/768* (2006.01)
*H01L 29/66* (2006.01)
*H01L 21/285* (2006.01)

(52) U.S. Cl.
CPC .. *H01L 21/76856* (2013.01); *H01L 21/28518* (2013.01); *H01L 21/76805* (2013.01); *H01L 21/76843* (2013.01); *H01L 21/76889* (2013.01); *H01L 21/76895* (2013.01); *H01L 29/66795* (2013.01)

(58) Field of Classification Search
CPC ......... H01L 21/76856; H01L 21/76895; H01L 21/76805; H01L 21/28518; H01L 21/76889; H01L 29/66795; H01L 21/76843
See application file for complete search history.

(56) References Cited

U.S. PATENT DOCUMENTS

| | | | |
|---|---|---|---|
| 5,545,592 A * | 8/1996 | Iacoponi | H01L 21/28518 257/E21.165 |
| 5,725,740 A | 3/1998 | Raaijmakers | |
| 5,801,097 A * | 9/1998 | Chang | H01L 21/76856 257/E21.584 |
| 5,856,237 A * | 1/1999 | Ku | C23C 16/42 438/683 |
| 6,008,124 A * | 12/1999 | Sekiguchi | H01L 21/28052 438/653 |
| 2008/0176401 A1 | 7/2008 | Chou et al. | |
| 2014/0084340 A1* | 3/2014 | Wang | H01L 29/0684 257/190 |
| 2016/0086805 A1* | 3/2016 | Xu | H01L 21/823871 438/299 |
| 2016/0351446 A1* | 12/2016 | Yamaguchi | H01L 23/485 |

* cited by examiner

*Primary Examiner* — Bilkis Jahan
*Assistant Examiner* — Victor V Barzykin
(74) *Attorney, Agent, or Firm* — Winston Hsu

(57) ABSTRACT

A method for fabricating semiconductor device includes the steps of: forming a gate structure on a substrate; forming a source/drain region adjacent to two sides of the gate structure; forming an interlayer dielectric (ILD) layer on the gate structure; forming a contact hole in the ILD layer to expose the source/drain region; forming a barrier layer in the contact hole; performing an anneal process; and performing a plasma treatment process to inject nitrogen into the contact hole.

7 Claims, 3 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of forming contact holes adjacent to two sides of a gate structure and then injecting nitrogen gas into the contact holes.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

However, poor adhesion between barrier layer and metal layer during the fabrication of contact plug has become a common problem in current FinFET process thereby affecting the performance of the device substantially. Hence, how to improve the current process to resolve this issue has become an important task in this field.

SUMMARY OF THE INVENTION

According to an embodiment of the present invention, a method for fabricating semiconductor device includes the steps of: forming a gate structure on a substrate; forming a source/drain region adjacent to two sides of the gate structure; forming an interlayer dielectric (ILD) layer on the gate structure; forming a contact hole in the ILD layer to expose the source/drain region; forming a barrier layer in the contact hole; performing an anneal process; and performing a plasma treatment process to inject nitrogen into the contact hole.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
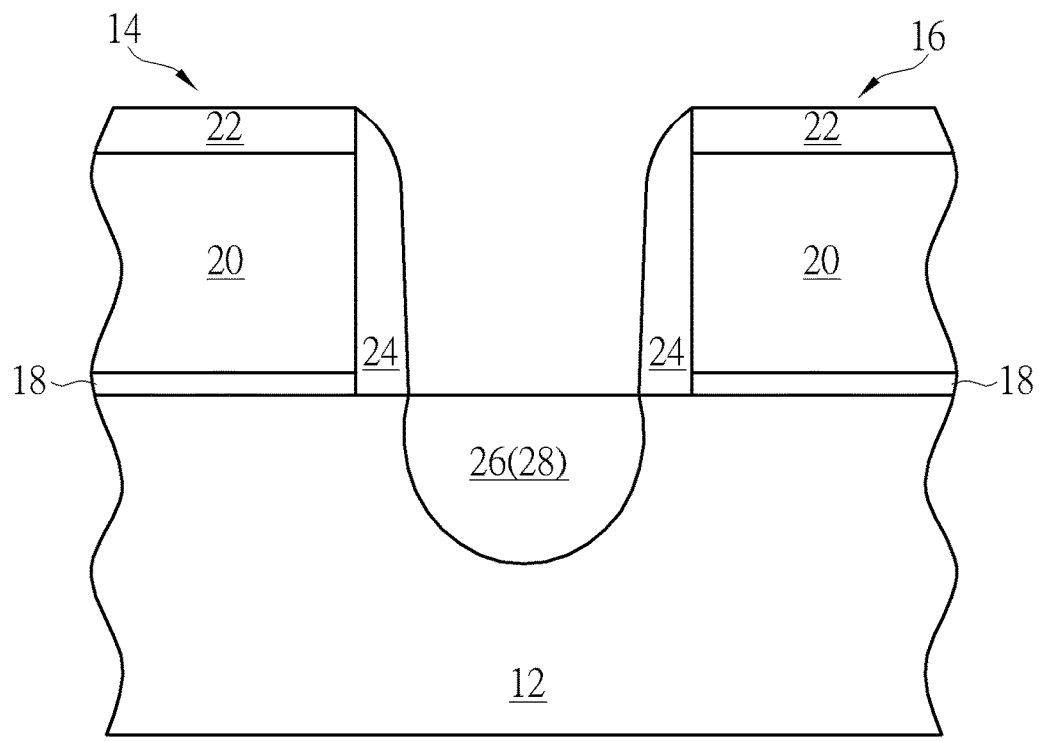
FIGS. 1-6 illustrate a method for fabricating semiconductor device according to an embodiment of the present invention.

Referring to FIGS. 1-6, FIGS. 1-6 illustrate a method for fabricating semiconductor device according to an embodiment of the present invention. As shown in FIG. 1, a substrate 12 is provided, and gate structures 14, 16 are formed on the substrate 12. In this embodiment, the formation of the gate structures 14, 16 could be accomplished by sequentially forming a gate dielectric layer, a gate material layer, and a hard mask on the substrate 12, conducting a pattern transfer process by using a patterned resist (not shown) as mask to remove part of the hard mask, part of the gate material layer, and part of the gate dielectric layer through single or multiple etching processes, and then stripping the patterned resist. This forms gate structures 14 and 16 composed of patterned gate dielectric layer 18, patterned gate material layer 20, and patterned hard mask 22.

It should be noted that even though two gate structures 14, 16 are disclosed in this embodiment, the quantity or number of the gate structures 14, 16 is not limited to two, but could all be adjusted according to the demand of the product. Moreover, only part of the gate structures 14, 16, such as the right portion of the gate structure 14 and left portion of the gate structure 16 are shown in FIG. 1 to emphasize the formation of contact plug between gate structures 14, 16 in later process.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 18 could include $SiO_2$, SiN, or high-k dielectric material; the gate material layer 20 could include metal, polysilicon, or silicide; the material of hard mask 22 could be selected from the group consisting of $SiO_2$, SiN, SiC, and SiON.

In addition, in an embodiment, a plurality of doped wells or shallow trench isolations (STIs) could be selectively formed in the substrate 12. Despite the present invention pertains to a planar MOS transistor, it would also be desirable to apply the process of the present invention to non-planar transistors such as FinFET devices, and in such instance, the substrate 12 shown in FIG. 1 would become a fin-shaped structure formed atop a substrate 12.

Next, at least a spacer 24 is formed on the sidewalls of the gate structures 14, 16, a source/drain region 26 and/or epitaxial layer 28 is formed in the substrate 12 adjacent to two sides of the spacer 24. In this embodiment, the spacer 24 could be a single spacer or a composite spacer, such as a spacer including but not limited to for example an offset spacer (not shown) and a main spacer (not shown). Preferably, the spacer 24 is made of silicon nitride, but could also include other materials including but not limited to for example $SiO_2$, SiON, SiCN, or combination thereof. The source/drain region 26 and the epitaxial layer 28 could include different dopants and/or different materials depending on the type of transistor being fabricated. For instance, the source/drain region 26 could include n-type dopants or p-type dopants depending on the type of device being fabricated.

Figure 2:
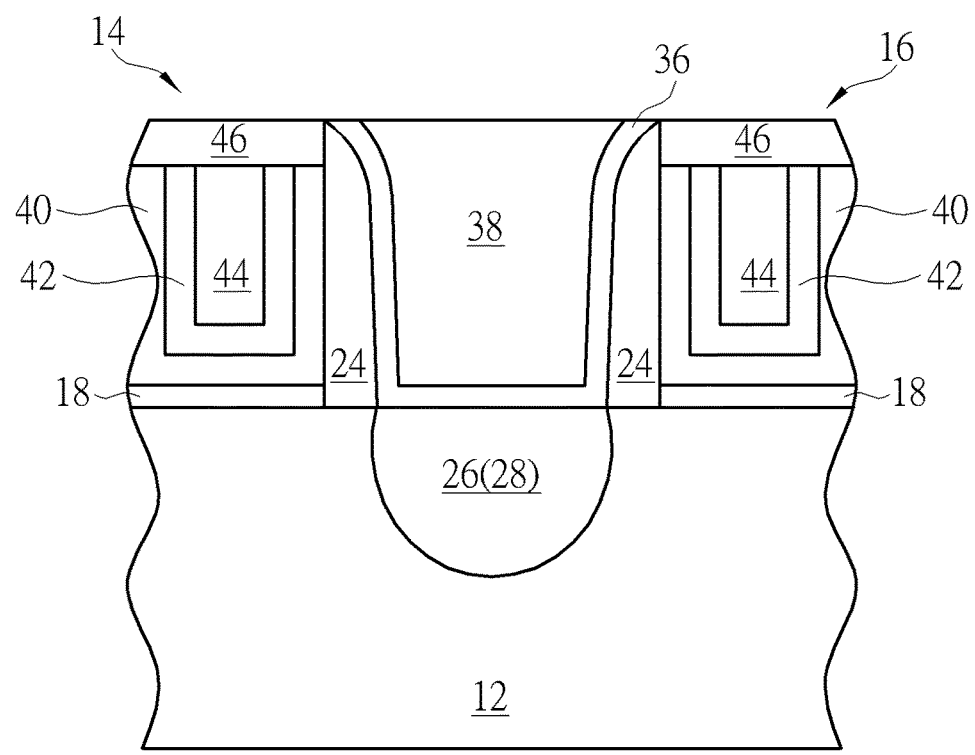

Next, as shown in FIG. 2, a contact etch stop layer (CESL) 36 made of silicon nitride could be formed on the substrate 12 to cover the gate structures 14, 16, and an interlayer dielectric (ILD) layer 38 is formed on the CESL 36. Next, a planarizing process, such as chemical mechanical polishing (CMP) process is conducted to remove part of the ILD layer 38 and part of the CESL 36 so that the top surfaces of the hard mask 22 and ILD layer 38 are coplanar.

Next, a replacement metal gate (RMG) process is conducted to transform the gate structures 14, 16 into metal gates. The RMG process could be accomplished by first performing a selective dry etching or wet etching process, such as using etchants including ammonium hydroxide ($NH_4OH$) or tetramethylammonium hydroxide (TMAH) to remove the hard masks 22 and gate material layer 20 from gate structures 14, 16 for forming recesses (not shown) in the ILD layer 38. Next, a high-k dielectric layer 40 and a conductive layer including at least a work function metal layer 42 and a low resistance metal layer 44 are formed in the recesses, and a planarizing process is conducted so that the surfaces of the U-shaped high-k dielectric layer 40, U-shaped work function metal layer 42, low resistance metal layer 44, and ILD layer 38 are coplanar.

In this embodiment, the high-k dielectric layer 40 is preferably selected from dielectric materials having dielectric constant (k value) larger than 4. For instance, the high-k dielectric layer 40 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 42 is formed for tuning the work function of the later formed metal gates to be appropriate in an NMOS or a PMOS. For an NMOS transistor, the work function metal layer 42 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 42 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 42 and the low resistance metal layer 44, in which the material of the barrier layer may include titanium (Ti), titanium nitride (TiN), tantalum (Ta) or tantalum nitride (TaN). Furthermore, the material of the low-resistance metal layer 44 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity. Next, part of the high-k dielectric layer 40, part of the work function metal layer 42, and part of the low resistance metal layer 44 are removed to form recesses (not shown), and hard masks 46 are formed in the recesses so that the top surfaces of the hard masks 46 and ILD layer 38 are coplanar. The hard masks 46 could be selected from the group consisting of silicon oxide, silicon nitride, silicon oxynitride, and silicon carbon nitride.

Figure 3:
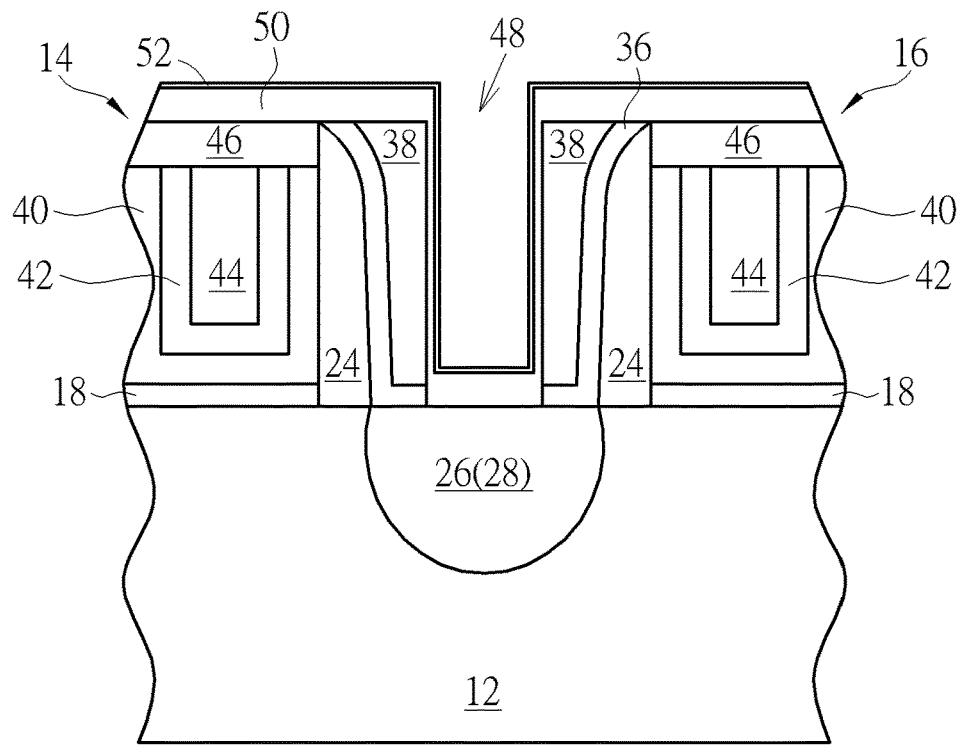
Figure 4:
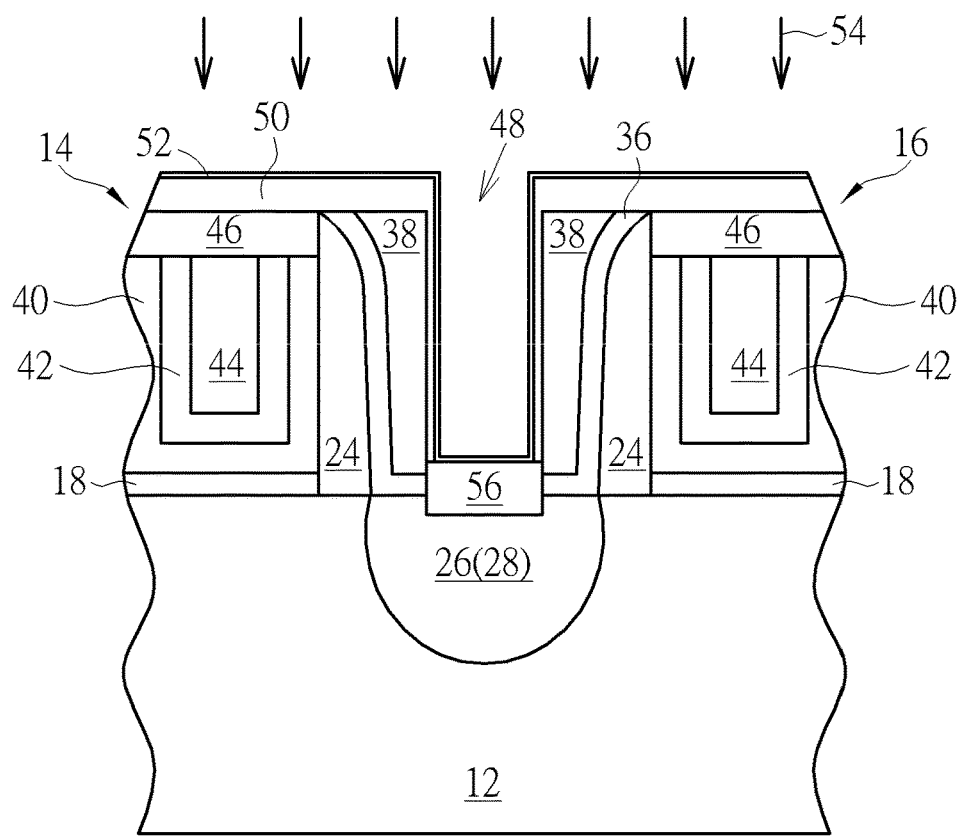

Next, as shown in FIG. 3, an etching process could be conducted by using a patterned mask (not shown) as mask to remove part of the ILD layer 38 and part of the CESL 36 adjacent to the gate structures 14, 16 to form contact holes 48 exposing the surface of the epitaxial layer 28, and a metal layer 50 and a barrier layer 52 are formed in the contact holes 48 without filling the holes completely. In this embodiment, the metal layer 50 is selected from the group consisting of Ti, Co, Ni, and Pt and most preferably Ti, and the barrier layer 52 could include metal alloys such as titanium nitride (TiN) or tantalum nitride (TaN) and most preferably TiN. It should be noted that the barrier layer 52 formed at this stage is preferably a TiN layer having low nitrogen ratio, in which the definition of low nitrogen ratio in this instance preferably refers to that the ratio of nitrogen atoms to titanium atoms is approximately 1.08.

Next, an anneal process 54 is conducted to form a silicide layer 56. Specifically, after depositing the metal layer 50 and barrier layer 52, the anneal process 54 conducted at this stage could be accomplished by sequentially conducting a first thermal treatment process and a second thermal treatment process to form a silicide layer 56 on the epitaxial layer 28. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

Figure 5:
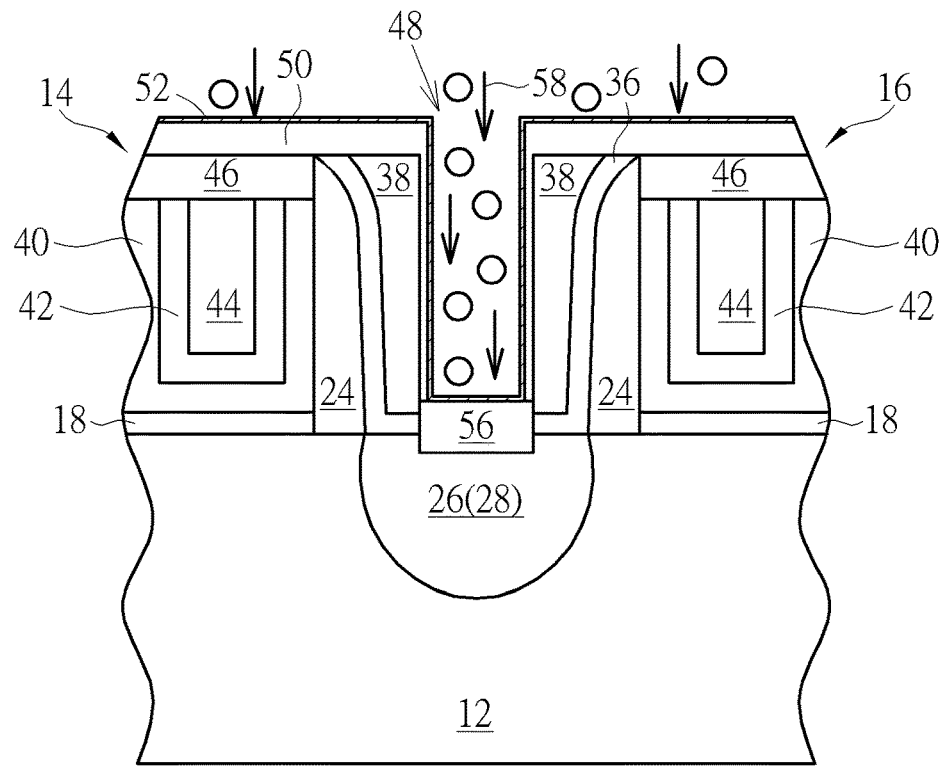

Next, as shown in FIG. 5, a plasma treatment process 58 is conducted to inject nitrogen or nitrogen atoms into the contact holes 48. Specifically, the plasma treatment process 58 conducted at this stage preferably injects nitrogen atoms from ammonia ($NH_3$) or any gas or source that could generate nitrogen into the barrier layer 52. By using the plasma treatment process 58 to increase the nitrogen to titanium ratio within the barrier layer 52, the barrier layer 52 having low nitrogen ratio before the plasma treatment process 58 is transformed into a TiN layer having high nitrogen ratio. Specifically, in contrast to the barrier layer 52 having a ratio of nitrogen to titanium at approximately 1.08 before the plasma treatment process 58, the ratio of nitrogen to titanium after injecting nitrogen atoms into the barrier layer 52 through plasma treatment process 58 is increased to approximately 1.2.

Figure 6:
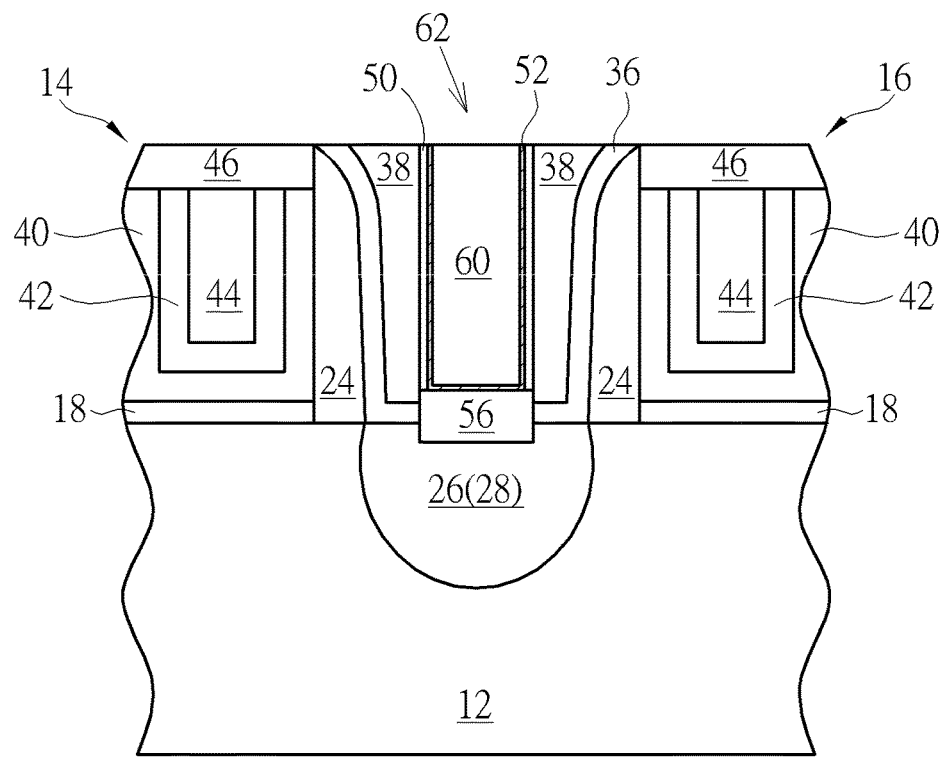

Next, as shown in FIG. 6, a conductive layer 60 is formed in the contact holes 48 to fill the holes completely. In this embodiment, the conductive layer 60 preferably includes tungsten (W), but not limited thereto. Next, a planarizing process such as CMP is conducted to remove part of the conductive layer 60, part of the barrier layer 52, part of the metal layer 50, and even part of the ILD layer 38 depending on the demand of the process to form contact plugs 62 electrically connecting the epitaxial layer 28 adjacent to two sides of the gate structures 14, 16. This completes the fabrication of a semiconductor device according to an embodiment of the present invention.

Typically, silicide process conducted during the formation of contact plugs is accomplished by first sequentially depositing a metal layer made of Ti and a barrier layer made of TiN into the contact holes. The content of nitrogen atoms within the barrier layer however often diminishes rapidly after the deposition process and causes poor adhesion between the barrier layer and the tungsten conductive layer deposited afterwards thereby resulting in defects. To resolve this issue, the present invention preferably conducts an extra plasma treatment process to inject nitrogen atoms into the barrier layer for re-boosting or increasing the diminished nitrogen content within the barrier layer after using anneal process to react the metal layer and part of the epitaxial layer into a silicide layer so that adhesion between barrier layer and the tungsten conductive layer formed afterwards will be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a gate structure on a substrate;
    forming a source/drain region adjacent to two sides of the gate structure;
    forming a contact etch stop layer on the substrate and the gate structure;
    forming an interlayer dielectric (ILD) layer on the gate structure and the contact etch stop layer;
    forming a contact hole in the ILD layer to expose the source/drain region;
    forming a metal layer made of titanium (Ti) in the contact hole and directly contacting the source/drain region;
    forming a barrier layer in the contact hole and on the metal layer, wherein the barrier layer comprises titanium nitride (TiN);
    performing an anneal process to form a silicide layer between the source/drain region and the barrier layer, wherein a top surface of the silicide layer is higher than a top surface of the source/drain region and a top surface of a portion of the contact etch stop layer on the source/drain region;
    after performing the anneal process performing a plasma treatment process to inject nitrogen into the barrier layer for increasing nitrogen to titanium ratio of the barrier layer; and
    forming a conductive layer filling the contact hole after performing the plasma treatment process.

2. The method of claim 1, further comprising:
    performing a planarizing process to the conductive layer, the barrier layer, and the metal layer to form a contact plug.

3. The method of claim 2, wherein the conductive layer comprises tungsten (W).

4. The method of claim 2, wherein after the planarizing process, a top surface of the conductive layer, a top surface of the barrier layer, and a top surface of the metal layer are flush with a top surface of the gate structure.

5. The method of claim 1, wherein the silicide layer comprises titanium silicide.

6. The method of claim 1, wherein the silicide layer is in direct contact with the source/drain region and the barrier layer.

7. The method of claim 1, wherein a bottom end of the metal layer between the barrier layer and the ILD layer directly contacts the top surface of the silicide layer.

* * * * *